United States Patent [19]

Nelson

[11] Patent Number: 4,953,116

[45] Date of Patent: Aug. 28, 1990

[54] DIGITAL WORD OUTPUT HIGH-PASS FILTER APPARATUS

[75] Inventor: Blaine J. Nelson, Plano, Tex.

[73] Assignee: Rockwell International Corporation, El Segundo, Calif.

[21] Appl. No.: 409,177

[22] Filed: Sep. 19, 1989

[51] Int. Cl.$^5$ .............................................. G06F 15/31
[52] U.S. Cl. ................................................. 364/724.01
[58] Field of Search ................... 364/724.01, 701, 703, 364/724.17, 724.06

[56] References Cited

U.S. PATENT DOCUMENTS 4,142,241  2/1979  Freilich et al. ................. 364/724.01
4,453,223  6/1984  Ravel .............................. 364/724.06

FOREIGN PATENT DOCUMENTS 2177565  1/1987  United Kingdom ........... 364/724.17

Primary Examiner—Gary V. Harkcom
Assistant Examiner—Tan V. Mai
Attorney, Agent, or Firm—Bruce C. Lutz; V. Lawrence Sewell; H. Fredrick Hamann

[57] ABSTRACT

A high-pass filter which provides a digital word output indicative of a high-pass filter function of the quantity of logic "1" inputs to the counter. The output of a counter is low-pass filtered and applied in conjunction with a bias signal to a second counter which counts clock inputs from a value determined by the count input from the low-pass filter to a predetermined limit and outputs a feedback pulse to be used by the first counter in opposition to a second bias string of pulses where the second bias string of pulses and the feedback signal have substantially the same frequency of pulse rate under steady state conditions of the filter.

8 Claims, 2 Drawing Sheets

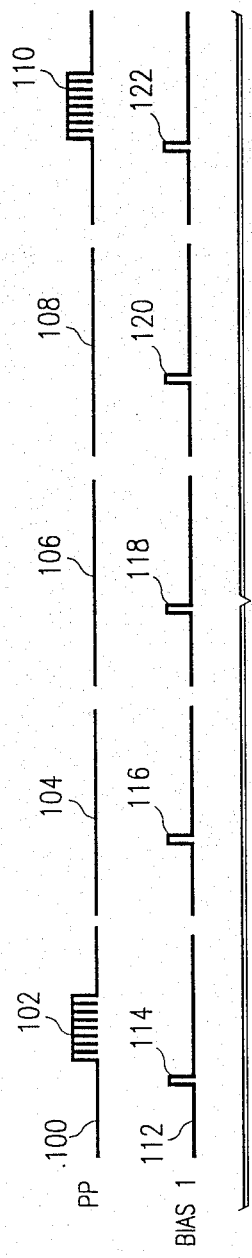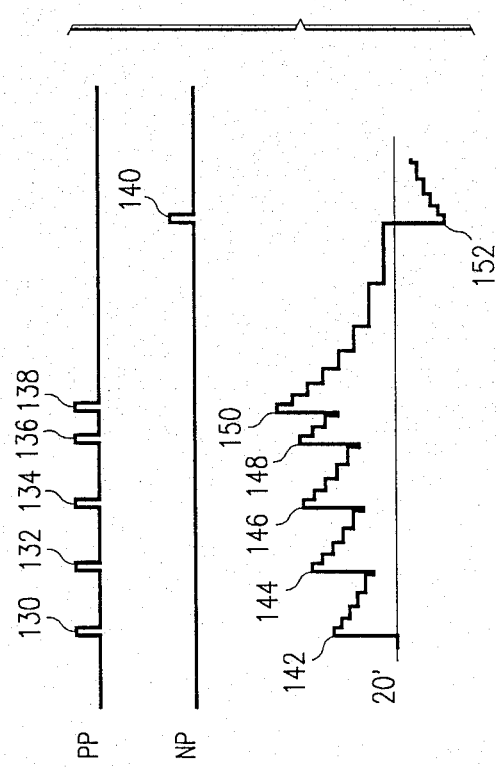
FIG. 4
FIG. 5

DIGITAL WORD OUTPUT HIGH-PASS FILTER APPARATUS

THE INVENTION

The present invention is generally concerned with electronics and more specifically concerned with filters. Even more specifically, it's concerned with the design of a digital word output filter which may be constructed entirely of digital logic components.

BACKGROUND

When phase-lock loop (PLL) techniques are used to produce digital filtering techniques, substantially identical circuitry may be used for either high-pass or low-pass filtering action with the inputs and outputs being taken at different places depending upon whether high-pass or low-pass filtering action is desired. Prior art PLL approaches to providing digital high-pass filtering action have not been economically attractive due to the approach contemplated to insure stability. Since the response time of a PLL-type filter becomes excessively long when the input to the controlled oscillator approaches zero, prior art PLL-type filters have only been used with a known range of positive frequency signals.

To the best of the inventor's knowledge, PLL-type digital filters have not been required to deal with positive and negative frequencies as well as the possibility of zero frequency as was required in the application of the present invention. Since there can't be a negative frequency in the analog world, it is doubtful that there is any remotely similar analog PLL-type circuitry.

The present invention was designed in response to a requirement for a filter which would provide a high-pass filter output in response to both positive and negative frequency indication signals as well as being stable in the absence of the occurrence of either of these signals. The output of the present circuit needed to be summed with a digital word signal to slowly increase or decrease the magnitude of that signal to prevent the disruption of signal processing in other circuitry in a telecommunication system.

The present invention accomplishes the high-pass filter function using two counters and a low-pass filter by incorporating a first bias into the divider signal and a complementary bias signal into the up/down counter. Using this approach, the divider signal never approaches zero amplitude and the implementation of the concept uses a minimum number of parts as compared to any known similar concepts in the prior art.

It is thus an object of the present invention to provide an improved high-pass filter.

Other objects and advantages of the present invention will be apparent from a reading of the specification and appended claims in conjunction with the drawings wherein:

FIG. 4 comprises a set of waveforms comparing the pulses to be filtered and the bias frequency pulses; and FIG. 5 comprises a set of waveforms showing the output of the filter as compared to various input sets of pulses to be high-pass filtered.

DETAILED DESCRIPTION

Figure 1:
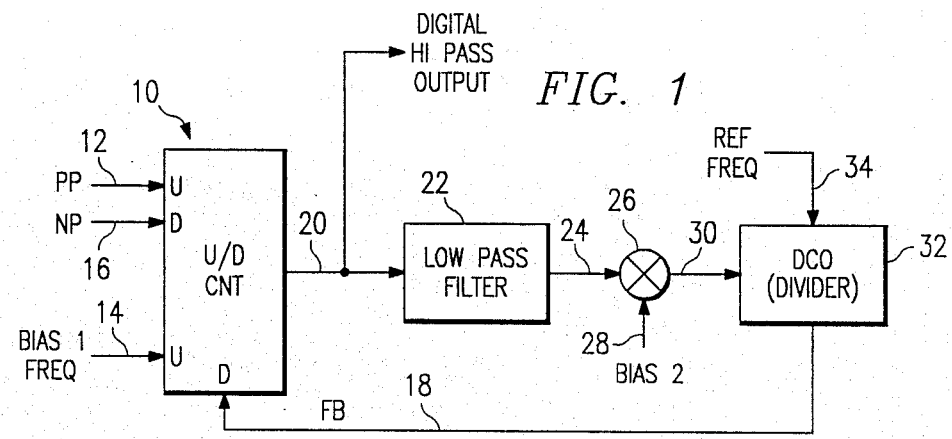
FIG. 1 is a block diagram of the high-pass filter concept.

In FIG. 1 an up/down counter generally designated as 10 has two up count inputs or increment inputs having leads 12 and 14 connected thereto and being supplied with positive pulse (PP) and bias 1 frequency pulses respectively. Up/down counter 10 additionally has two decrement or down inputs with leads 16 and 18 connected thereto. Lead 16 has negative sets of pulses applied thereto while lead 18 has the feedback pulses applied thereto. An output 20 of the up/down counter 10 provides apparatus digital high-pass output words to further circuitry as well as to a low-pass filter 22. Filter 22 provides an output on a lead 24 to a summing means 26 having a bias 2 input 28. The summing means 26 and the bias 2 signal in one embodiment of the invention was designed into the low-pass filter function of block 22. An output of summing means 26 is supplied on a lead 30 to a digitally controlled oscillator or divider or counter 32. Counter 32 receives a clock or reference frequency input on a lead 34 and has a feedback output previously labeled as 18. In one embodiment of the invention, the reference frequency on lead 34 was 51.84 megahertz while the frequency of the bias signal on lead 14 was four kilohertz. The bias signal on lead 28 was 4D60 hex which equates to a decimal number of 12,959. In a stable or non-input state, the counter 32 would count from 12,959 to 32,767 and output a pulse FB. It would then load a new digital word which would again be 12,959 as modified by any outputs from low-pass filter 22 and count to its maximum limit of 32,767 before outputting a further feedback pulse.

Figure 2:
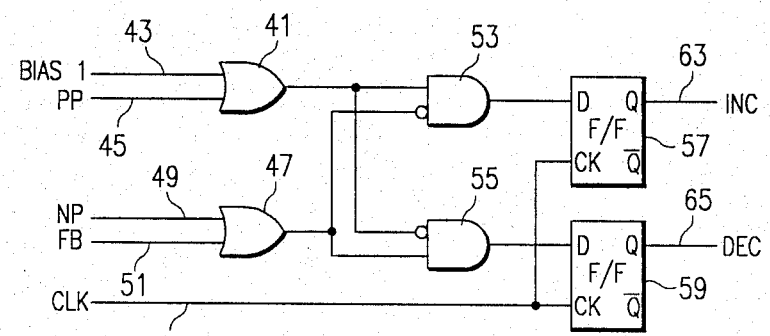
FIG. 2 is a detailed block diagram of the combinational logic which may be used to combine the inputs to the up/down counter of FIG. 1.

In FIG. 2 an OR gate 41 receives bias 1 and positive (PP) signals on leads 43 and 45. Leads 43 and 45 correspond to 14 and 12 in FIG. 1. A further OR gate 47 receives negative (NP) pulses and feedback (FB) pulses on leads 49 and 51 respectively. These signals correspond to similarly labeled leads in FIG. 1. An output of OR gate 41 is applied to an input of an AND gate 53 and to an inverting input of a further AND gate 55. An output of OR gate 47 is supplied to an inverting input of AND gate 53 and to an input of AND gate 55. An output of AND gate 53 is supplied to a D input a flip-flop generally designated as 57 while an output of AND gate 55 is supplied to D input of a further flip-flop 59. A clock input is supplid on a lead 61 to the clock (CK) inputs to both flip-flops 57 and 59. An output of flip-flop 57 is shown in lead 63 and would be an increment signal supplied to the counter portion of counter 10 while an output of flip-flop 59 is labeled 65 and would be supplied to a decrement input of up/down counter 10.

Although a preferred embodiment utilized NAND gates and NOR gates for cost effectiveness, it was believed that the circuit illustrated in FIG. 2 would be simpler to explain and functionally performs the identical function to that utilized in the circuit reduced to practice. The combinational circuit of FIG. 2 is designed to provde an increment output when there is either a bias 1 or PP input signal and there is neither an NP or FB signal. On the other hand, a decrement output is provided on lead 65 when there is either an NP or FB signal and there is not a bias 1 or PP signal.

Figure 3:
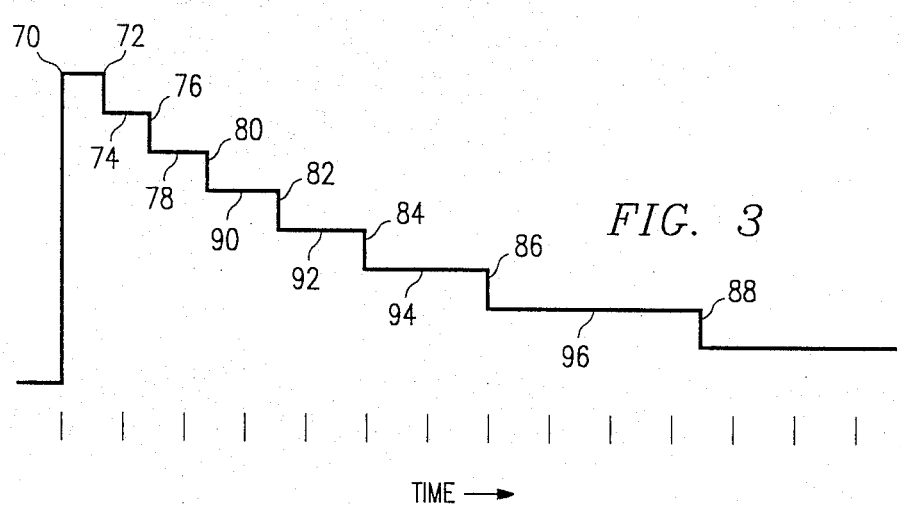
FIG. 3 is a representation of the digital output that might be obtained from the up/down counter of FIG. 1 with a single set of positive pulses applied thereto to be high-pass filtered.

The waveform of FIG. 3 shows an output representative of that appearing on lead 20 of FIG. 1 in response to a single isolated input on lead 12. A single set of inputs causes the output to reach some maximum value designated as 70. At a time 72 the output drops to a value 74. The time between 70 and 72 is shorter than the time between 72 and a next time 76. At time 76, the output drops to a value 78. Further times 80, 82, 84, 86, and 88 are illustrated. Each of the values 90, 92, 94, and 96 remain at their given levels for a longer time period. The digital output representation is equivalent to and representative of the analog waveform produced by $R^{-at}$. Such a curve is commonly referred to as an RC time constant curve. A value substantially equivalent to $e^{-3}$ would produce a digital word zero output since at that point the output would be equal to or less than 5% of the initial value. Since one embodiment of the inventive concept utilized eight discrete steps from any given maximum to a minimum, eight levels are shown in FIG. 3.

In FIG. 4 a waveform illustrative of the PP signal on lead 12 of FIG. 1 is provided as waveform 100. A logic "1" is designated as 102, and in one embodiment of the invention, comprises eight clock periods. The waveform 100 contains several segments 104, 106, 108, and 110 to illustrate time compression. The separate segments are broken but are intended to illustrate that the PP sets of pulses cannot occur any more often than once every fourth bias 1 pulse. The bias 1 pulses are shown on waveform representation 112 and illustrates pulses 114, 116, 118, 120, and 122. One embodiment of the inventive concept divided a 51.84 megahertz signal by 32767-12959 to produce the bias 1 signal. The eight PP pulses 102 are thus representative of the time for eight 51.84 megahertz clock signals to occur. It should also be noted that the logic is designed such that the PP pulses and the bias 1 pulses cannot occur at the same time. The breaks between the various segments of the waveforms of FIG. 4 is due to the fact that there are 12,959 clocks between adjacent bias 1 pulses such as 114 and 116.

FIG. 5 illustrates a waveform PP with pulses 130, 132, 134, 136, and 138. Each one of these is a logic "1" for a period of eight clock pulses. A further waveform NP is shown with a single negative pulse 140 which also is representative of being a logic "1" for eight clock pulses. A final waveform designated as 20' starts at ground potential and has a first peak 142 responsive to PP pulse 130, a second peak 144 responsive to PP pulse 132, a third peak 146 responsive to PP pulse 136, a fourth peak 148 responsive to PP pulse 136 and a final positive peak 150 responsive to PP pulse 138. After point 150, the output declines to a point coincident with pulse 140 at which time the output decreases to a negative value designated as 152. The waveform 20' is a series of step functions similar to that shown in FIG. 3.

OPERATION

The very basic concept of the high-pass filter should be somewhat obvious to anyone skilled in the art from the information contained in the Background and Detailed Description. As will be realized, the up/down counter 10 in a stable apparatus condition where no inputs have been received on leads 12 or 16 for a long period of time, will have an output digital word at lead 20 which is effectively or substantially zero. Thus, the output of low-pass filter 22 will be a digital zero and the signal on lead 30 going into divider 32 will be identical to the bias 2 word appearing on leading 28. Since the digitally controlled oscillator or divider 32 is, in actuality, in one embodiment of the invention, merely a further counting device, the clock signals appearing on lead 34 continuously increment counter 32. Each time the counter 32 reaches a limit such as 32,767 as it did in one embodiment of the invention, an output pulse is supplied on the feedback line 18. If the clock or reference frequency on lead 34 is 51.84 megahertz and the digital word on lead 28 is equivalent to 12,959, the frequency of occurrence of pulses on lead 18 would be exactly four kilohertz. Thus, if the signal on lead 14 is also a four kilohertz pulse, the system will remain in a stable condition with no outputs appearing on lead 20. Even if the signals on leads 28 and 34 are such that the signal on lead 18 is not exacty the same as that on lead 14, the apparatus of FIG. 1 will still provide an output on lead 20 which has an average value of zero for the long term. If, when the apparatus of FIG. 1 is in a stable condition, a signal if supplied on lead 12 as is shown by 102 in FIG. 4, a new digital word will appear on lead 20. If the signal 102 remains in a logic "1" condition for a period of eight clock pulses of counter 10, an output digital word of the equivalent of eight will appear on output 20. The low-pass filter 22 will pass the integral of this signal to output 24 so that the summation digital word at output 30 will change and will used as the starting count point by divider 32 after the issuance of the next feedback pulse. Thus, a period of time from 70 to 72 in FIG. 3 is required before there is enough difference in the frequency of signals on lead 18 as compared to that on lead 14 to reduce the output of counter 10 to the level shown as 74 in FIG. 3. During this time, the output of low-pass filter 22 is increasing in steps if it is a digital low-pass filter, and is continuously increasing if it is in analog-type filter. It should be mentioned that although this concept is being described as being a completely digital high-pass filter including all of its components, the apparatus can be a hybrid assembly of analog and digital circuits if there is a desire to have a hybrid system. In such a case, the device 32 may be a controlled oscillator and the filter 22 may be an analog RC-type filter while the bias 2 on lead 28 may be a stable reference voltage.

In any event, the output of filter 22 continues to provide an output until the system again stabilizes. If further pulses are received on either leads 12 or 16, then a signal such as shown as 20' in FIG. 5 may result, assuming the input pulses on leads 12 and 16 are as shown by waveforms PP and NP in FIG. 5.

The waveforms of FIG. 4 are shown to reference the fact that as designed, the system was restricted from having more than one set of pulses or logic "1" values on either 12 or 16 any more often than every four occurrences of the lead 14 logic "1" condition. While this is merely a design parameter, it was believed that any more frequent occurrences of the negative or positive position pulses would require undue digital number size and thus, commercially, costly component complexity and substrate area.

Although the present invention was designed to inject a digital word into a circuit which digital word changes over a period of time in the same manner as having a signal applied to a high-pass filter, I wish to be limited not to the specific implementation illustrated, but only to a high-pass filter having a digital word output representative of the high-pass filtered version of input signals and conforming to the appended claims wherein I claim:

1. High-pass filter apparatus comprising, in combination:

up/down pulse counter means including up count first and second means and down count third and fourth means along with output digital word fifth means, the digital word provided by said fifth means being indicative of the integrated total of positive and negative counts of pulses being supplied to the first through fourth count means;

input signal sixth means, connected to said up count first means, for supplying pulses indicative of a positive digital count;

input signal seventh means, connected to said down count third means, for supplying pulses indicative of a negative digital count;

summing eight means, connected to said fifth means of said pulse counter means for receiving digital words therefrom, said eighth means including digital word output ninth means for providing a weighted average of previously supplied input words as a digital output;

digitally controlled oscillator tenth means, connected to said ninth means of said summing eighth means for dividing a high frequency signal by a value indicative of the sum of a digital word received from said eighth means and a bias frequency digital word, said tenth means including pulse output signal means for providing output pulses indicative of the division process;

eleventh means connecting said output of said tenth means to said fourth means of said counter means; and bias frequency twelfth means connected to said second means of said counter means of a frequency equivalent said high frequency signal divided by said bias frequency digital word.

2. The method of minimizing the response time of an up/down input signal and feedback signal counter, a weighted average summing means for summing a biasing numeric value input with an input received from the signal counter after a weighted average of the signal counter input has been taken, and a frequency controlled reference frequency signal dividing signal generator connected in a closed loop to provide the function of a high-pass filter comprising the steps of:

biasing the input to the summing means with a first bias signal which bears an integer relationship to the frequency of a reference signal used by the signal dividing signal generator; and biasing the up/down counter with a second signal having a frequency which is equivalent to said integer relationship.

3. High-pass filter apparatus comprising, in combination:

up/down counter means including up count first and second means and down count third and fourth means along with output digital word fifth means, the digital word provided by said fifth means being indicative of the integrated total of positive and negative count signals being supplied to the first through fourth count means;

input signal sixth means, connected to said up count first means, for supplying signals resulting in a positive digital count;

input signal seventh means, connected to said down count third means, for supplying signals resulting in a negative digital count;

summing eighth means, connected to said fifth means of said pulse counter means for receiving digital words therefrom, said eighth means including word output ninth means for providing a weighted average of previously supplied input words as an output;

controlled signal divider tenth means, connected to said ninth means of said summing eighth means for dividing a high frequency reference signal by a value indicative of the sum of the signal received from said eighth means and a first bias signal, said tenth means including output signal means for providing an output signal indicative of the division process;

eleventh means connecting said output of said tenth means to said fourth means of said counter means; and bias frequency twelfth means connected to said second means of said counter means for supplying a second bias signal equivalent to said high frequently reference signal divided by said first bias signal.

4. High-pass filter apparatus comprising, in combination:

multiple pulse signal input digital counter first means, including apparatus output means, for providing a summation digital count output indicative of the total number of input pulses received;

signal supplying second means, connected to a first input of said first means, for supplying a signal thereto to be high-pass filtered;

signal summing third means, connected to said apparatus output means, for converting the digital count output by said first means to a time weighted average value biased by an amount indicative of a first frequency signal;

controlled frequency signal generating fourth means having an output signal at an output means thereof having a pulse frequency, in the absence of any time weighted average value signal, which bears an integer relationship to an internal reference frequency signal and said first frequency signal;

further fifth means connecting said output means of said fourth means to a second input of said firt means; and bias sixth means, connected to a third input of said first means, for supplying a set of pulses indicative of said integer relationship, the signal at said apparatus output being a digital signal which is substantially zero in the absence of any recent inputs by said second means.

5. High-pass filter apparatus comprising, in combination:

multiple pulse signal input digital counter first means, including apparatus output means, for providing a summation digital count output indicative of a totaled characteristic the input signals received;

signal supplying second means, connected to a first input of said first means, for supplying a signal thereto to be high-pass filtered;

first order low-pass filter third means, connected to said apparatus output means, for electrically filtering the digital count output by said first means to a value biased by an amount indicative of a first frequency signal;

frequency controllable signal generating fourth means having an output signal at an output means thereof having a frequency, in the absence of any filtered signal, which bears an integer relationship to an internal reference frequency signal and said first frequency signal;

further fifth means connecting said output means of said fourth means of a second input of said first means to complete a closed feedback loop; and bias sixth means, connected to a third input of said first means, for supplying a signal indicative in frequency of said integer relationship, the signal at said apparatus output being a digital signal which is substantially zero in the absence of any recent inputs by said second means.

6. The method of providing a digital output high-pass filter function comprising the steps of:

logically combining increment, decrement, feedback and bias 1 signal pulses to increment a digital output counter when either the increment signal OR the bias 1 signal is a logic "1" AND neither the decrement OR the feedback signal are a logic 1 and to decrement the digital output counter when either the decrement signal OR the feedback signal is a logic 1 AND neither the increment OR the bias 1 signal are a logic 1;

outputting a digital word output from the digital counter as an apparatus output indicative of a high-pass filter function of any received increment or decrement signals;

low-pass filtering the digital word output of said digital output counter to produce a correction signal;

summing a bias 2 signal with said correction signal to generate a divider signal;

periodically generating a feedback pulse after counting a number of reference frequency pulses where the number is a function of said divider signal;

supplying a bias 1 signal to be logically combined where the bias 1 signal has substantially the same frequency of occurrence as the frequency of the feedback pulses; and supplying increment or decrement signals to be logically combined and high-pass filtered.

7. The method of filtering a set of logic 1 values to provide a set of digital output words indicative of high-pass filtering of those values comprising the steps of:

a. up/down counting the exclusive occurrence of increment and decrement input signals having a given logic value simultaneously with a clock signal to provide an apparatus output first digital word which in the absence of input signals to be filtered is indicative of zero;

b. low-pass filtering the apparatus output first digital word to produce a second digital word;

c. logically summing said second digital word with a bias third digital word to produce a fourth digital word;

d. unidirectionally counting clock pulses from a point indicative of said fourth digital word to a predetermined limit;

e. producing a feedback output pulse upon reaching said predetermined limit;

f. resetting to a current fourth digital word and continuously repeating steps (d) and (e); and g. logically combining said feedback signal, a further bias pulse signal, and any signals to be high-pass filtered and producing increment and decrement input signals to be counted in step (a) where the further bias pulse signals and the feedback pulse signals are substantially the same frequency and cause up/down counting in opposite directions.

8. High-pass filter apparatus comprising, in combination:

low-pass filter means, including digital word input means and digital word output means, for providing a digital word output corresponding to a first order low-pass filter function of any received digital word input offset by a first bias digital word;

first counter means, including reference clock input means, digital input means connected to said digital word output means of said low-pass filter means, and feedback pulse output means, for counting supplied clock signals from a digital word input by said filter means to a predetermined digital value and outputting a feedback pulse each time the predetermined digital value count is reached;

second counter means, including digital word output means connected to said input means of said low-pass filter means and including incrementing and decrementing count pulse input means;

means for supplying a second bias pulse signal and the feedback pulse of said first counter means to said input means of said second counter means to have opposite count effects on said second counter means; and signal input means, connected to one of said incrementing and decrementing count pulse input means of said second counter means, for supplying thereto a signal to be high-pass filtered, the high-pass filtered output signal appearing at said digital word output means of said second counter means.

* * * * *